(12) United States Patent
Loh et al.

(10) Patent No.: US 11,804,253 B2
(45) Date of Patent: Oct. 31, 2023

(54) CONTINUOUS THIN FILM OF A METAL CHALCOGENIDE

(71) Applicant: NATIONAL UNIVERSITY OF SINGAPORE, Singapore (SG)

(72) Inventors: Kian Ping Loh, Singapore (SG); Sock Mui Poh, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 84 days.

(21) Appl. No.: 17/273,990

(22) PCT Filed: Sep. 6, 2019

(86) PCT No.: PCT/SG2019/050447
§ 371 (c)(1),
(2) Date: Mar. 5, 2021

(87) PCT Pub. No.: WO2020/050778
PCT Pub. Date: Mar. 12, 2020

(65) Prior Publication Data
US 2021/0358533 A1    Nov. 18, 2021

(30) Foreign Application Priority Data

Sep. 6, 2018 (SG) .......................... 10201807668R

(51) Int. Cl.
| | |
|---|---|
| *G11C 16/04* | (2006.01) |
| *G11C 11/22* | (2006.01) |
| *C23C 14/06* | (2006.01) |
| *C23C 14/30* | (2006.01) |
| *C23C 14/54* | (2006.01) |
| *C23C 14/56* | (2006.01) |
| *H01L 21/02* | (2006.01) |

(Continued)

(52) U.S. Cl.
CPC .......... *G11C 11/22* (2013.01); *C23C 14/0623* (2013.01); *C23C 14/30* (2013.01);
(Continued)

(58) Field of Classification Search
CPC ..................................................... G11C 11/22
See application file for complete search history.

(56) References Cited

U.S. PATENT DOCUMENTS

| | | | | |
|---|---|---|---|---|
| 8,741,688 | B2 * | 6/2014 | Quick | ............... C23C 16/45525 257/53 |
| 9,583,703 | B2 * | 2/2017 | Campbell | ............. H01L 45/144 |

(Continued)

FOREIGN PATENT DOCUMENTS

| | | |
|---|---|---|
| CN | 107142459 | 9/2017 |
| CN | 109285945 | 1/2019 |

OTHER PUBLICATIONS

International Search Report for PCT/SG2019/050447, dated Nov. 18, 2019, 6 pages.

(Continued)

*Primary Examiner* — Pho M Luu
(74) *Attorney, Agent, or Firm* — Nixon & Vanderhye, P.C.

(57) ABSTRACT

A continuous thin film comprises a metal chalcogenide, wherein the metal is selected from the periodic groups 13 or 14 and the chalcogen is: sulphur (S), selenide (Se), or tellurium (Te), and wherein the thin film has a thickness of less than 20 mm. Methods of forming the continuous thin film involve thermally evaporating precursors to form a thin film on the surface of a substrate. In a particular embodiment, molecular beam epitaxy (MBE) is used to grow indium selenide (In2Se3) thin film from two precursors (In2Se3 and Se) and the thin film is used to fabricate a ferroelectric resistive memory device.

20 Claims, 4 Drawing Sheets

(51) Int. Cl.
    *H10N 70/00* (2023.01)
    *H01L 29/872* (2006.01)
(52) U.S. Cl.
    CPC .......... *C23C 14/541* (2013.01); *C23C 14/542* (2013.01); *C23C 14/56* (2013.01); *H01L 21/02568* (2013.01); *H10N 70/028* (2023.02); *H10N 70/841* (2023.02); *H10N 70/8825* (2023.02); *H01L 29/872* (2013.01)

(56) References Cited

U.S. PATENT DOCUMENTS

| | | | | |
|---|---|---|---|---|
| 2007/0238247 | A1* | 10/2007 | Ou | .................... H01L 21/02568 257/E21.414 |
| 2017/0301385 | A1 | 10/2017 | Liu et al. | |

OTHER PUBLICATIONS

Written Opinion of the ISA for PCT/SG2019/050447, dated Nov. 18, 2019, 7 pages.

Zhou et al., "Thickness-Dependent Thermal Conductivity of Suspended Two-Dimensional Single-Crystal $In_2Sr_3$ Layers Grown by Chemical Vapor Deposition", The Journal of Physical Chemistry C, Feb. 17, 2016, vol. 120, No. 9, pp. 4753-4758.

Baek et al., "Synthesis of SnS Thin Films by Atomic Layer Deposition at Low Temperatures", Chemistry of Materials, Sep. 13, 2017, vol. 29, No. 19, pp. 8100-8110.

Poh et al., "Molecular-Beam Epitaxy of Two-Dimensional $In_2Se_3$ and Its Giant Electroresistance Switching in Ferroresistive Memory Junction", Nano Letters, Sep. 7, 2018, vol. 18, No. 18, pp. 6340-6346.

* cited by examiner (C)

CONTINUOUS THIN FILM OF A METAL CHALCOGENIDE

This application is the U.S. national phase of International Application No. PCT/SG2019/050447 filed 6 Sep. 2019, which designated the U.S. and claims priority to SG Patent Application No. 10201807668R filed 6 Sep. 2018, the entire contents of each of which are hereby incorporated by reference.

TECHNICAL FIELD

The present invention relates to a continuous thin film of a metal chalcogenide. The present invention also relates to an asymmetric junction comprising the thin film and a method of making the thin film.

BACKGROUND

Ferroelectric thin film has attracted great interests for nonvolatile memory applications and can be used in either ferroelectric Schottky diode or ferroelectric tunnelling junction, due to its promise of fast switching speed, high on-off ratio and non-destructive readout.

Ferroelectric Schottky diodes (FSDs) with polarization-modulated Schottky barriers are promising for applications in resistive switching memories but its performance in terms of ON/OFF ratio and readout current densities are much poorer than ferroelectric tunnelling junction (FTJ). This is because the insulating properties of oxide-based ferroelectric materials limit the maximum diode current, which precludes the stable detection of memory status using sense amplifiers, especially in miniaturized circuit elements. Using thinner materials to improve current density, however, compromises the ferroelectric properties due to the presence of depolarization field which strongly suppresses spontaneous polarization in thin materials. The ideal ferroelectric material should, therefore, possess a modest band gap, and also the ability to retain spontaneous out-of-plane polarization when scaled down to ultrathin level. 2D indium selenide ($\alpha$-$In_2Se_3$) exhibits spontaneous electric polarization. Its unique noncentrosymmetric crystal structure leads to an intrinsic stabilization of in-plane and out-of-plane polarizations through dipole-locking, giving rise to multidirectional piezoelectricity for applications such as electronic skin and energy-harvesting cell, as well as ferroelectricity for switchable diode devices. The ferroelectric properties of $In_2Se_3$ may provide additional control in applications of optoelectronics, photovoltaics and thermoelectrics. However, to date, $In_2Se_3$ has been used in thick films using indium elemental source while only isolated micrometer-sized $\alpha$-$In_2Se_3$ crystals have been grown using chemical vapour deposition (CVD) and physical vapour deposition (PVD) approaches.

There is therefore a need for a continuous thin film of a metal chalcogenide.

SUMMARY OF THE INVENTION

The present invention seeks to address these problems, and/or to provide a continuous thin film comprising a metal chalcogenide. The present invention also provides a method of making the continuous thin film comprising a metal chalcogenide.

The thin film according to the present invention may comprise any suitable metal chalcogenide. For example, the metal chalcogenide may be $In_2Se_3$. In particular, two-dimensional $\alpha$-phase indium selenide ($In_2Se_3$), which has modest band gap and robust ferroelectric properties stabilized by dipole-locking, may be an excellent candidate for multidirectional piezoelectric and switchable photodiode applications.

According to a first aspect, the present invention provides a continuous thin film comprising a metal chalcogenide, wherein the metal is selected from periodic groups 13 or 14 and chalcogen is: sulphur (S), selenide (Se), or tellurium (Te), and wherein the thin film has a thickness of 20 nm.

According to a particular aspect, the metal may be, but not limited to: indium (In), gallium (Ga), tin (Sn), germanium (Ge), or alloys thereof.

The thin film may comprise any suitable metal chalcogenide. For example, the metal chalcogenide may be selected from, but not limited to: $In_2Se_3$, $In_2S_3$, $Ga_2Se_3$, $Ga_2S_3$, SnS, SnSe, GeSe, $In_2Te_3$, SnTe, GeTe, GaTe, or a combination thereof.

For the purposes of the present invention, the thin film comprising the metal chalcogenide is defined as having a thickness of $\leq 20$ nm. According to a particular aspect, the thin film may have a thickness of $\leq 10$ nm.

The thin film may be provided on a substrate. The substrate may be any suitable substrate. For example, the substrate may comprise a hexagonal lattice symmetry. In particular, the substrate may be, but not limited to, graphene, highly ordered pyrolytic graphite or hexagonal boron nitride.

According to a second aspect, there is provided an asymmetric junction comprising the continuous thin film according to the first aspect.

The asymmetric junction may further comprise a first electrode and a second electrode, wherein the continuous film may be sandwiched between the first electrode and the second electrode. Alternatively, the continuous film may form a channel between the first electrode and the second electrode in a lateral configuration.

In particular, the first electrode and the second electrode may have a dissimilar work function. Even more in particular, the first electrode may comprise a lower work function compared to the second electrode.

According to a particular aspect, the first electrode may comprise a hexagonal lattice symmetry. For example, the first electrode may be, but not limited to: graphene, highly ordered pyrolytic graphite, or hexagonal boron nitride. The second electrode may be, but not limited to: gold (Au), platinum (Pt), palladium (Pd), cobalt (Co), nickel (Ni) or alloys thereof. In particular, the first electrode may be graphene and the second electrode may be Au.

According to a third aspect, the present invention provides a method of forming the continuous thin film according to the first aspect directly on a substrate, the method comprising:
providing precursors and a substrate, wherein the precursors comprise a metal chalcogenide and a chalcogen, wherein the metal is selected from the periodic groups 13 or 14 and the chalcogen is: sulphur (S), selenide (Se) or tellurium (Te); and
thermally evaporating the precursors in a vacuum chamber to directly form a thin film of the metal chalcogenide on a surface of the substrate, wherein the vacuum chamber is at a pre-determined pressure and the substrate is at a temperature 350° C.

According to a particular aspect, the providing may comprise providing an excess of the chalcogen as compared to the metal chalcogenide. The providing may further comprise providing the chalcogen separately from the metal chalcogenide.

The metal chalcogenide and the substrate may be as described above.

The method may further comprise degassing the substrate prior to the thermally evaporating. For example, the degassing may comprise flash annealing to a pre-determined temperature. The pre-determined temperature may be any suitable temperature. In particular, the pre-determined temperature may be 250-300° C.

According to a particular aspect, the thermally evaporating may comprise evaporating the precursors with an electron beam source. During the thermally evaporating step, the substrate may be at a temperature of 150-300° C.

The pre-determined pressure may be any suitable pressure. In particular, the pre-determined pressure may be $1 \times 10^{-6}$-$1 \times 10^{-9}$ Torr.

The method may further comprise annealing the thin film in a chalcogenide-rich environment. In particular, the annealing may comprise annealing at a temperature of 250-350° C.

The present invention also provides a method of forming an asymmetric junction according to the second aspect. The method may comprise:
forming a continuous thin film comprising a metal chalcogenide directly on a surface of a substrate according to the method of the third aspect, wherein the substrate is a first electrode; and
forming a second electrode on the thin film comprising the metal chalcogenide.

According to a particular aspect, the forming a second electrode may comprise thermal evaporation.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings.

DETAILED DESCRIPTION

Figure 1:
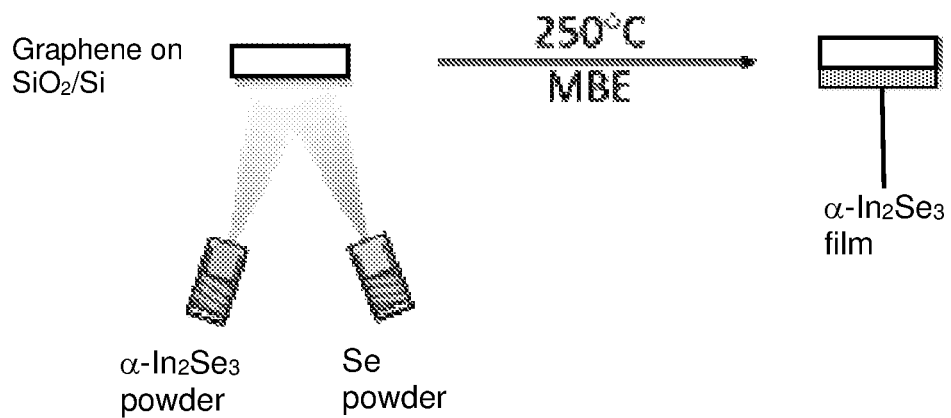
FIG. 1 shows a schematic representation of the method to prepare a continuous thin film according to one embodiment of the present invention.

As explained above, there is a need for a continuous thin film comprising a metal chalcogenide and an improved method of forming the continuous thin film comprising metal chalcogenide.

The continuous thin film comprising a metal chalcogenide may be used as a ferroelectric material. Ferroelectrics are materials which possess a spontaneous electric polarization that can be reversed by the application of an external electric field. Ferroelectric material can be used in memory storage devices. Ferroelectric resistive memory device present a novel mechanism for data storage as well as the prospect for device miniaturization and increased chip memory capacity by reducing the dimensions of the ferroelectric component to the nanometer scale. It revolves around the use of a ferroelectric material between two metal electrodes to control the flow of charge carriers between them by the switching of the ferroelectric polarization direction. As such, memory is stored via the polarization state. Writing and reading of information are controlled by voltage bias applied. Important figure of merits in such memory cell include the electroresistance ratio and the current density. Resistive random access memories (RRAMs) are important for the next generation of non-volatile memories due to their unique advantages such as excellent scalability, fast switching, high integration density and good compatibility with the current complementary metal oxide semiconductor (CMOS) technology. The intrinsic physical phenomenon behind RRAMs is resistive switching (RS), which means that the device can be freely programmed into a high resistance state (HRS) or a low resistance state (LRS) under external electric field.

The ability to grow ultrathin metal chalcogenide films allows for planar miniaturization and for increasing the chip capacity of memory storage device. The present invention therefore provides a highly continuous and highly crystalline metal chalcogenide thin film, and a method of forming the same.

According to a first aspect, the present invention provides a continuous thin film comprising a metal chalcogenide, wherein the metal is selected from the periodic groups 13 or 14 and chalcogen is: sulphur (S), selenide (Se) or tellurium (Te), and wherein the thin film has a thickness of ≤20 nm.

According to a particular aspect, the thin film may be a ferroelectric thin film.

For the purposes of the present invention, the thin film comprising the metal chalcogenide is defined as having a thickness of ≤20 nm. According to a particular aspect, the thin film may a thickness of ≤10 nm.

The thin film according to the present invention may have a thickness of 1-10 atomic layers. In particular, the thin film may have a thickness of about 4-6 atomic layers. For example, the thickness of the thin film may be 1-10 nm, 2-9 nm, 3-8 nm, 4-7 nm, 5-6 nm. Even more in particular, the thickness of the thin film may be about 6-10 nm.

The metal comprised in the metal chalcogenide may be any suitable metal selected from the periodic groups 13 or 14. In particular, the metal may be, but not limited to: indium (In), gallium (Ga), tin (Sn), germanium (Ge), or alloys thereof. Even more in particular, the metal may be In.

The metal chalcogenide comprised in the thin film may be any suitable metal chalcogenide. For example, the metal chalcogenide may be, but not limited to: $In_2Se_3$, $In_2S_3$, $Ga_2Se_3$, $Ga_2S_3$, SnS, SnSe, GeSe, $In_2Te_3$, SnTe, GeTe, GaTe, or a combination thereof. In particular, the metal chalcogenide may be $In_2Se_3$.

The thin film may be provided on a surface of a substrate. The substrate may be any suitable substrate. For example, the substrate may be any suitable substrate comprising a hexagonal lattice symmetry. In particular, the substrate may be, but not limited to, graphene, highly ordered pyrolytic graphite or hexagonal boron nitride. Even more in particular, the substrate may be graphene.

The present invention also provides, according to a second aspect, an asymmetric junction comprising the continuous thin film described above. The asymmetric junction may further comprise a first electrode and a second electrode, wherein the continuous film may be sandwiched between the first electrode and the second electrode.

The first electrode and the second electrode may be any suitable electrode. For example, the first electrode and the second electrode may be selected such that they may have a dissimilar work function from each other. In particular, the first electrode may comprise a lower work function compared to the second electrode. According to a particular aspect, the first electrode may have a lower work function compared to the work function of the thin film and the second electrode may have a higher work function compared to the work function of the thin film. Even more in particular, the first electrode may have a work function of ≤4.6 eV. The second electrode may have a work function of ≥4.8 eV.

The first electrode may comprise a hexagonal lattice symmetry. For example, the first electrode may be, but not limited to: graphene, highly ordered pyrolytic graphite, hexagonal boron nitride, or a combination thereof. In particular, the first electrode may be the substrate on which the continuous thin film according to the first aspect is formed. Even more in particular, the first electrode may be graphene.

The second electrode may be, but not limited to: gold (Au), platinum (Pt), palladium (Pd), cobalt (Co), nickel (Ni), or alloys thereof. According to a particular aspect, the first electrode may be graphene and the second electrode may be Au.

The asymmetric junction may be comprised in a resistive switching device. When the thin film is in contact with a second electrode of a larger work function, a Schottky barrier may be formed at the interface. The Schottky barrier height may be modulated by switching the electric dipole moment in the thin film. This effect may change the resistance across the junction significantly. This effect may be enlarged largely by the reduced dielectric screening of the thin film when its thickness is reduced to a few layers, such as for example, but not limited to, 5-6 atomic layers. By using a first electrode and a second electrode of widely dissimilar work function, a large polarization effect may be achieved to produce a giant electroresistance effect. The design of the asymmetric junction may be based on either a vertical structure, with the first and second electrodes at the top and bottom of the thin film (vertical configuration), or a lateral one with the first and second electrodes on the left and right side of the thin film (lateral configuration).

The ability to grow ultrathin thin films allows for planar miniaturization and for increasing the chip capacity of a memory storage device.

The present invention also provides a method of forming the continuous thin film described above directly on a surface of a substrate. With the direct formation of the thin film on the surface of the substrate, the fabrication of resistive switching devices comprising such thin films may be simplified. The present method enables growth of continuous thin films comprising metal chalcogenides with controllable thickness of 20 nm. In particular, most chemical vapour deposition methods known in the art produce isolated crystals and not continuous films. The method of the present invention allows highly crystalline metal chalcogenide, such as $In_2Se_3$ to be grown on a substrate such as graphene. This may be followed by the deposition of a high work functional metal, such as gold, to form an asymmetric structure such as gold-$In_2Se_3$-graphene, which may form the basis of a resistive switching device, in which the substrate and the high work functional metal may be the electrodes. For example, the electrodes may be gold and graphene. A typical memory device based on a 6-atomic layer of thin film according to the present invention, such as a continuous thin film of $In_2Se_3$, may demonstrate a giant electroresistance ratio as high as $3.9 \times 10^6$ and current density of $>10$ A/cm$^2$. This is comparable to FLASH memories and very high for few-nanometer scale ferroelectric resistive switching devices.

According to a third aspect, the present invention provides a method of forming the continuous thin film according to the first aspect directly on a substrate, the method comprising:

providing precursors and a substrate, wherein the precursors comprise a metal chalcogenide and a chalcogen, wherein the metal is selected from the periodic groups 13 or 14 and the chalcogen is: sulphur (S), selenide (Se), or tellurium (Te); and thermally evaporating the precursors in a vacuum chamber to directly form a thin film of the metal chalcogenide on a surface of the substrate, wherein the vacuum chamber is at a pre-determined pressure and the substrate is at a temperature 350° C.

According to a particular aspect, the providing may comprise providing an excess of the chalcogen as compared to the metal chalcogenide. The providing may further comprise providing the chalcogen separately from the metal chalcogenide. According to a particular aspect, the ratio of the metal chalcogenide to the chalcogen may be at least 1:2. In particular, the ratio may be 1:2-1:10, 1:3-1:9, 1:4-1:8, 1:5-1:7, 1:6-1:6.5. Even more in particular, the ratio may be 1:6. In particular, the provision of the separate chalcogen source in the providing aids in the suppression of defects and vacancy formation. With minimised defects in the thin film, the ferroelectricity of the thin film may be significantly improved.

The precursors may be in any suitable form. For example, the precursors may be in powder form.

The metal chalcogenide, the chalcogen and the substrate may be any suitable metal chalcogenide, chalcogen and substrate, respectively. For example, the metal chalcogenide, chalcogen and substrate may be as described above. In particular, the metal chalcogenide may be $In_2Se_3$ and the chalcogen may be Se. In particular, the substrate may be graphene.

The method may further comprise degassing the substrate prior to the thermally evaporating. For example, the degassing may comprise flash annealing to a pre-determined temperature. The pre-determined temperature may be any suitable temperature. For example, the pre-determined temperature may be 250-300° C. In particular, the pre-determined temperature may be about 270° C.

According to a particular aspect, the thermally evaporating may comprises evaporating the precursors with an electron beam source. During the thermally evaporating step, the substrate may be at a suitable temperature. For example, the substrate may be at a temperature of 150-300° C. In particular, the substrate may be at a temperature of about 250° C.

The pre-determined pressure may be any suitable pressure. In particular, the pre-determined pressure may be $1 \times 10^{-8}$-$1 \times 10^{-9}$ Torr. Even more in particular, the pre-determined pressure may be about $1 \times 10^{-8}$ Torr.

The thickness of the thin film may be controlled by controlling the growth flux and the growth duration.

The method may further comprise annealing the thin film in a chalcogenide-rich environment. In particular, the annealing may comprise annealing at a suitable temperature. For example, the annealing may be at a temperature of 250-350° C. Even more in particular, the temperature may be about 300° C. The annealing of the thin film may contribute to the suppression of defects in the thin film.

According to one embodiment, there is provided a method for directly depositing a continuous thin film of $In_2Se_3$ on a graphene substrate. A schematic representation of the method is shown in FIG. 1. $In_2Se_3$ film may be prepared directly on graphene-on-$SiO_2$/Si substrate via thermal evaporation of precursors in an ultra-high vacuum (UHV) chamber with base pressure of about $6\times10^{-10}$ torr (See FIG. 1). Prior to growth, the substrate may be degassed in an ultrahigh vacuum chamber via flash annealing to a temperature of about 270° C. To grow the $In_2Se_3$ thin film, powdered $In_2Se_3$ and Se may be evaporated from a crucible of an electron beam source and a standard Knudsen cracker cell, respectively. The temperature of the Se crucible cell may be maintained at 150° C. with the cracker at a temperature of about 220° C. Temperature of $In_2Se_3$ crucible may be about 500° C. The flux ratio of Se:$In_2Se_3$ may be about 6:1. During growth, the substrate temperature may be maintained at about 250° C. and the chamber pressure may be about $1\times10^{-8}$ torr. The thickness of the $In_2Se_3$ film may be controlled between 1-10 layers by controlling the growth flux and growth duration. Post-annealing may be carried out in an Se environment at about 300° C.

Figure 2:
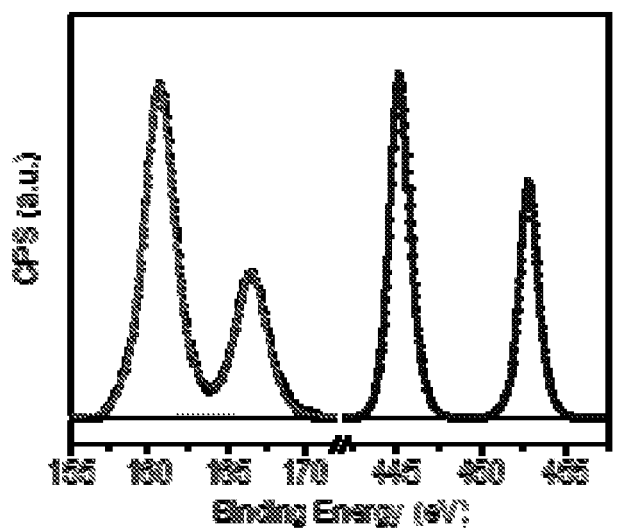
FIG. 2 shows a x-ray photoelectron spectroscopy.
Figure 3:
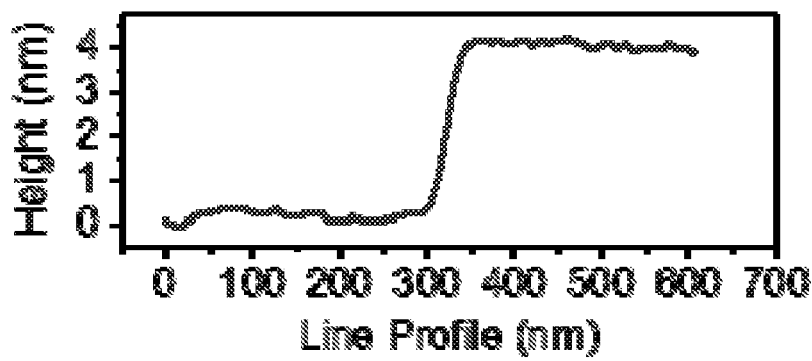
FIG. 3 shows the atomic force microscope height image of a grown thin film.

FIG. 2 shows a X-ray photoelectron spectroscopy showing the Se and In elemental peaks, thereby proving that the deposited film on the substrate is stoichiometric $In_2Se_3$. FIG. 3 shows the atomic force microscope height image of the grown $In_2Se_3$ film, with thickness corresponding to 4 atomic layers or less from a scraped off step.

The present invention also provides a method of forming an asymmetric junction according to the second aspect. The method may comprise:

forming a continuous thin film comprising a metal chalcogenide directly on a surface of a substrate according to the method of the third aspect, wherein the substrate is a first electrode; and forming a second electrode on the thin film comprising the metal chalcogenide.

According to a particular aspect, the forming a second electrode may comprise thermal evaporation.

Figure 4:
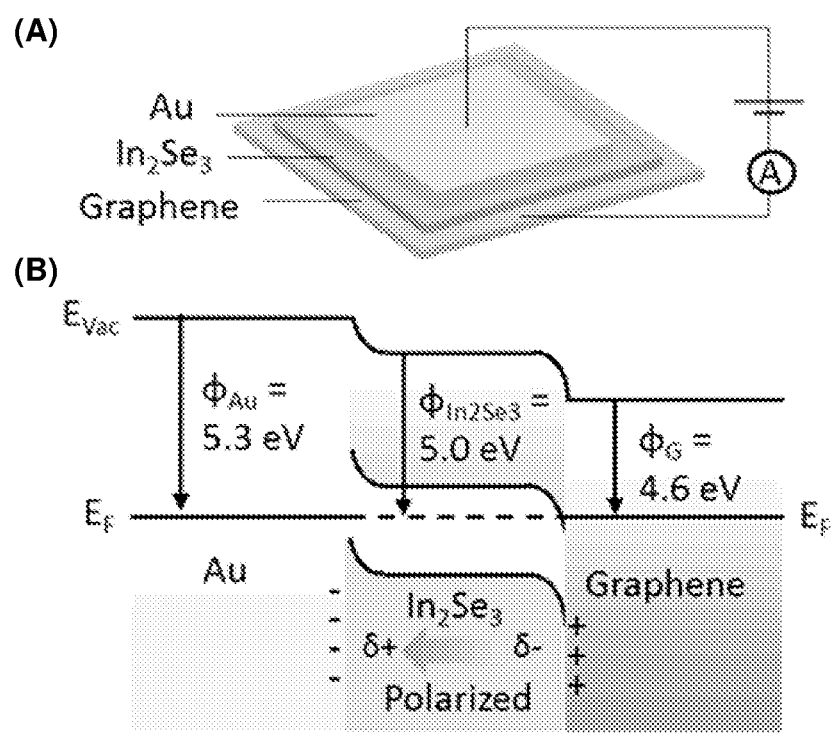
FIG. 4(a) shows a schematic representation of a asymmetric junction according to one embodiment of the invention.
FIG. 4(b) shows a band diagram of the metal-ferroelectric-metal junction.
FIG. 4(c) shows the current output measurement against voltage input with respect to the bottom electrode.
Figure 4:
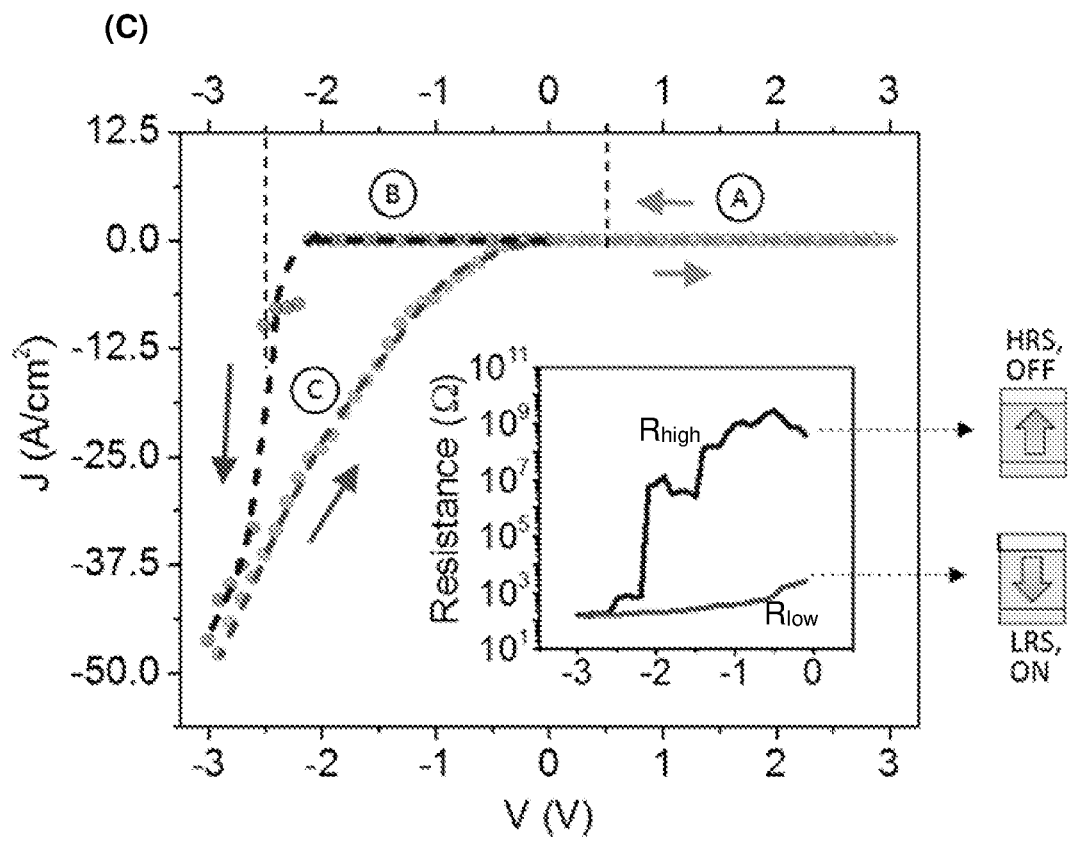

An example of an asymmetric junction is shown in FIG. 4(A). FIG. 4(B) shows the band diagram of the metal-ferroelectric-metal junction. In particular, it can be seen that the space-charged regions at the two metal-semiconductor interfaces are at equilibrium. FIG. 4(C) shows the current output measurement against the voltage input with respect to the bottom (second) electrode. The inset shows the resistance measured in the negative voltage range where the large hysteresis is observed, with illustration of the respective polarization direction for the OFF (high resistance, $R_{high}$) and ON (low resistance, $R_{low}$) states.

As shown in FIG. 4(C), the junction maintains its resistance state in the range of $-2<V<0$, and only switches between these two states at $<-3$ V or $>1$ V, for example. Hence, non-destructive readout may be performed at $-1$ V and the current output can be used to determine the resistance state of the junction.

According to one embodiment, the present invention provides a method to directly grow highly crystalline, continuous, ultrathin $In_2Se_3$ films on graphene to form a $In_2Se_3$-graphene heterostructure. Highly crystalline graphene may ensure the aligned epitaxy growth of the $In_2Se_3$ crystals. The growth may also extend to hexagonal symmetry substrates such as hexagonal boron nitride.

According to another embodiment, there is provided a method to grow layer-precise $In_2Se_3$, which can be tuned between 1 to 10 atomic layers. The ability to grow atomically thin layers allows electric field to penetrate the active layer easily and allows fast switching of the ferroelectric domains.

There is also provided a method to fabricate a resistive switching memory device (memristor) on $In_2Se_3$ that utilizes asymmetric electrodes to increase the polarization across the junction, whereby one of the electrodes is graphene, and another electrode can be gold or other metal with high work function. The use of high work function metal allows a high Schottky barrier to be induced at one side of the $In_2Se_3$ electrode.

Whilst the foregoing description has described exemplary embodiments, it will be understood by those skilled in the technology concerned that many variations may be made without departing from the present invention.

Having now generally described the invention, the same will be more readily understood through reference to the following examples which are provided by way of illustration, and are not intended to be limiting.

EXAMPLE

Example 1

Two-dimensional α-phase indium selenide ($In_2Se_3$), which has modest band gap and robust ferroelectric properties stabilized by dipole-locking, is an excellent candidate for multidirectional piezoelectric and switchable photodiode applications. This example provides a low-temperature molecular beam epitaxy (MBE) method of growing large-area monolayer α-$In_2Se_3$ on graphene and also demonstrates the use of α-$In_2Se_3$-on-graphene in ferroelectric Schottky diode junction by employing high work function gold as the top electrode. The polarization-modulated Schottky barrier formed at the interface exhibit giant electroresistance ratio of $3.9\times10^6$, with readout current density of $>12$ A/cm$^2$, which is more than 200% higher than the state-of-the-art. The MBE growth method allows high-quality ultrathin film of $In_2Se_3$ to be heteroepitaxially grown on graphene, thereby simplifying the fabrication of high performance 2D ferroelectric junction for ferroresistive memory applications.

The molecular beam epitaxy of continuous, centimetre-sized monolayer α-$In_2Se_3$ on single-layer graphene using twin evaporation of $In_2Se_3$ and Se precursors is exemplified. The optimized growth temperature of 250° C. presents process advantages because it is significantly lower than CVD and PVD growth temperatures, which are typically $>600°$ C. The growth method is highly versatile, and the conditions can be tuned to grow monolayer α-$In_2Se_3$, γ-$In_2Se_3$ or InSe.

Piezoresponse force microscopy (PFM) was used to characterize the ferroelectric properties of as-grown α-$In_2Se_3$ film of ~6 nm thickness with coercive voltages observed at $+0.5$ V and $-2.5$ V. MBE-grown few-layer α-$In_2Se_3$-on-graphene was readily fabricated into a ferroresistive Schottky diode by using gold as the top electrode, achieving a giant electroresistance with ON/OFF ratio up to $3.9\times10^6$, which is comparable to the state-of-the-art FTJs. The current density obtained at the reading voltage of $-1.4$ V is at least 12 A/cm$^2$, which is sufficient for detection by sense amplifier even when miniaturized. Unlike FTJs, the fabricated $In_2Se_3$ ferroelectric junction did not need additional engineering of interface barrier material.

MBE Growth of Samples

Indium selenides were grown in a customized MBE chamber with a base pressure of about $6\times10^{-10}$ Torr. Prior to growth, the substrate was degassed in an ultra-high vacuum chamber for 30 mins and annealed at 600° C. for 5 mins. Single layer graphene on $SiO_2/Si$ was used as the substrate, unless otherwise stated. Ultra-pure $In_2Se_3$ powder (99.99%) and Se pellets (99.999%) were evaporated from a crucible heated by an electron beam source and a hot-lip effusion cell, respectively. For growth of $In_2Se_3$, the temperature of Se crucible cell was maintained at 150° C. with the hot-lip at 220° C. The flux ratio of the precursors are as described in main text. The chamber pressure during growth was about $1\times10^{-8}$ Torr when selenium source was used, and about $6\times10^{-9}$ Torr when only $In_2Se_3$ was evaporated.

Atomic Force Microscopy

Atomic force microscopy was performed using Bruker Dimension FastScan Atomic Force Microscope in non-contact mode at room temperature. High-resolution piezo-response force microscopy (PFM) measurements were carried out with commercial scanning probe microscope (Asylum Research MFP-3D) instrument at ambient atmosphere. Pt coated tips (AC240™, spring constant of ~2 $Nm^{-1}$, Olympus, Japan) were used to measure the local switching spectrum and out-of-plane PFM image. The typical scan rate for all scan modes was 1 Hz. The drive frequency, drive amplitude ($V_{AC}$) and trigger force was ~270 kHz, 1 V and 80 nN, respectively. To induce polarization in the ferroelectric material, a −6V DC voltage was applied to the conductive tip onto the sample, and scan via normal PFM measurements.

Raman Spectroscopy

Raman spectra were recorded at room temperature using the confocal WiTec Alpha 300R Raman Microscope with laser excitation at 532 nm and power of <100 µW.

Scanning Transmission Electron Microscopy

Scanning transmission electron microscopy-annular dark field (STEM-ADF) imaging was performed using an aberration-corrected JEOL ARM200F, equipped with a cold field emission gun, operating at 80 kV.

High-Resolution Electron Energy Loss Spectroscopy

HREELS measurements were performed using a Delta 0.5 spectrometer (SPECS, GmbH) with a specular geometry in the coarse mode. The impinging electron energy is set to 16 eV with an energy resolution of 30 meV.

X-Ray and Ultraviolet Photoemission Spectroscopies

XPS characterizations were performed using SPECS XR-50 X-ray Mg Kα (1253.7 eV) source with a pass energy of 30 eV and a spot size of 5 mm. Detection was done by a PHOIBOS 150 hemispherical energy analyser (SPECS, GmbH). The binding energies of the XPS spectra were calibrated using Au $4f_{7/2}$ peaks. XPS peak fitting was carried out using a mixed Gaussian-Lorentzian function after a Shirley background subtraction. Area ratios of 3:2 between the In $3d_{5/2}$ and In $3d_{3/2}$, and 2:1 between the Se $3p_{3/2}$ and Se $3p_{1/2}$ peaks were employed in the fit with same FWHM. UPS measurements were performed with monochromated photon energy of 21.2 eV (He I) and 40.8 eV (He II) through a toroidal mirror monochromator (SPECS GmbH). The detector used is the same as XPS characterizations. The experiments were performed in a chamber of base pressure better than $5\times10^{-10}$ mbar.

Device Fabrication and Measurements

Top gold electrodes of thickness 50 nm were deposited via thermal evaporation directly on the $\alpha$-$In_2Se_3$-graphene samples using copper grid mask of hole 200 um×200 um. Electrical measurements were carried out at room temperature using Keithley 6430 SourceMeter to record J(V) curves (0→+3.0V→−3.0V→0).

Results and Discussion

Monolayer indium selenide was epitaxially grown on single-layer graphene substrate at 250° C. using powdered $In_2Se_3$ and Se precursors, as shown schematically in FIG. 1. In order to obtain high quality $\alpha$-$In_2Se_3$ film, a high flux ratio of Se:$In_2Se_3$ of about 6:1 was needed. Keeping all other growth parameters constant, when only $In_2Se_3$ was evaporated, monolayer InSe was grown instead. This can be attributed to the decomposition of $In_2Se_3$ in Se-deficient environment. The phases of the grown films were unambiguously determined by Raman spectroscopy. For the film grown without Se precursor, four peaks were observed at about 116, 178, 200 and 227 $cm^{-1}$. When the film was grown with the co-evaporation of $In_2Se_3$ and Se precursors, pure phase $\alpha$-$In_2Se_3$ could be grown, as judged by the presence of the Raman signature peaks of $\alpha$-$In_2Se_3$ at about 108, 176, 205 $cm^{-1}$, respectively. Also investigated was the growth condition of Se: $In_2Se_3$ ~3:1 and obtained Raman spectrum dominated by peaks associated with InSe but with an extra peak at ~208 $cm^{-1}$, which most likely originated from $\alpha$-$In_2Se_3$.

The morphology of the films grown under different conditions was analysed using atomic force microscopy (AFM). In contrast to InSe, the nucleation density of $\alpha$-$In_2Se_3$ was much lower and its grains were much larger, better faceted, and highly oriented. On the other hand, the AFM of the mixed phase indium selenide showed similar grain size to that of pure InSe, however, there were buckling of grain boundaries, which may be due to lateral lattice mismatch of InSe and $\alpha$-$In_2Se_3$. Such mixed-phase 2D materials may be developed for unique electronic, chemical and optical applications.

The growth mechanism of the $\alpha$-$In_2Se_3$ films followed the Frank-van der Merwe growth mode, in which lateral growth occured much faster than vertical growth. Optimum MBE growth of $\alpha$-$In_2Se_3$ occurred at 250° C., as further increase in growth temperature resulted in a high desorption rate of grown $In_2Se_3$ film. The growth of $\alpha$-$In_2Se_3$ at this temperature was sufficient for the grains to coalesce and form continuous monolayer film with a growth rate of one monolayer in 2 hours, which was much faster than the >10 hrs/ML MBE growth of monolayer transition metal dichalcogenides (TMDCs) reported in prior art. The monolayer $\alpha$-$In_2Se_3$ was easily damaged under voltage-biased AFM tip or laser illumination due to its low thermal conductivity, and this property was exploited for the precise nanoscale etching and patterning of the ultrathin film, without the use of any mask or complicated lithography procedure. A rectangular pattern was etched in the 4-nm thick $\alpha$-$In_2Se_3$ with a 10 V-biased AFM tip.

Figure 5:
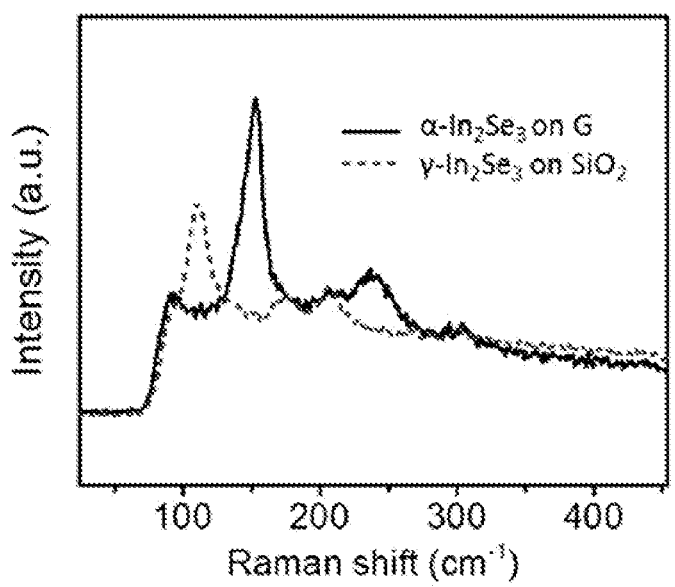
FIG. 5 shows the Raman spectrum of $\gamma$-$In_2Se_3$ grown on $SiO_2$/Si substrate, as compared to that of $\alpha$-$In_2Se_3$ grown on graphene.

Other than studying growth parameters such as substrate temperature and precursor flux ratio, also investigated was the effect of substrate on the phase of the as-grown material, which is especially relevant for $In_2Se_3$ due to its rich polymorphism. AFM topographic scans showed that the grains grown on the epitaxial graphene substrate were well-aligned with 60° orientation. For control experiment, the same growth on non-epitaxial $SiO_2/Si$ substrate was performed. Non-epitaxial $SiO_2/Si$ substrate is a commonly used substrate for CVD growth of single crystal TMDC. A non-layered growth morphology due to the growth of γ-In$_2$Se$_3$ was obtained, as verified by the Raman signature peaks of this phase at 152, 209 and 237 cm$^{-1}$ as shown in FIG. 5. This shows that for the MBE growth of van der Waals 2D film, a substrate with matching crystal symmetry is required, in agreement with previous MBE studies of 2D transition metal dichalcogenides.

The MBE growth of α-In$_2$Se$_3$ film is highly scalable, and this was demonstrated on a 1-cm$^2$ CVD graphene on SiO$_2$/Si, prepared by the method described in Abidi Irfan et al, *Adv. Fund. Mat.*, 2017, 27(23):1700121. Raman spectra recorded from random spots on the grown sample were almost identical, attesting to the uniformity of the grown film. X-ray photoemission spectroscopy (XPS) was used to probe the elemental composition and oxidation states of the grown film. The spectra exhibited two doublets with binding energies of 166.5, 160.7, 452.7 and 445.2 eV, which were assigned to the In$_2$Se$_3$ XPS peaks for Se 3p$_{1/2}$, Se 3p$_{3/2}$, In 3d$_{3/2}$ and In 3d$_{5/2}$ core level orbitals, respectively. The elemental composition of In and Se was obtained by peak fitting with a mixed Gaussian-Lorentzian function after a Shirley background subtraction. XPS chemical composition analysis indicated an In:Se ratio of 2:3, confirming the presence of a pure In$_2$Se$_3$ phase. There was very little surface oxidation, since XPS only detected physisorbed oxygen.

The electronic bandgap of the as-grown α-In$_2$Se$_3$ sample can be measured using high-resolution electron energy loss spectroscopy (HREELS). The energy loss region was scanned in a specular geometry with incident electron energy of 16 eV and the energy gap was determined from the sharp spectral onset delineated by an enhanced intensity from the background, which originated from interband electronic transitions. An energy onset of ~1.55 eV was observed, which corresponded to the direct electronic bandgap of α-In$_2$Se$_3$. Scanning transmission electron microscopy-annular dark field (STEM-ADF) image of the monolayer film showed periodic hexagonal P63/mmc crystal lattice with lattice constant of 4.0 Å which corresponds to the crystal structure of α-In$_2$Se$_3$. Therefore, both spectroscopic and microscopic characterizations unambiguously identified the grown film as the alpha phase of In$_2$Se$_3$.

Figure 6:
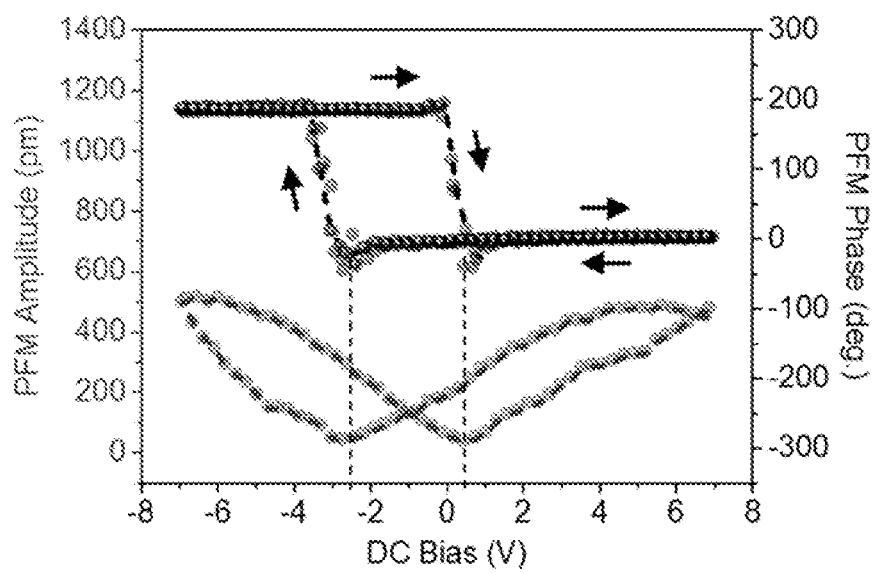
FIG. 6 shows the local PFM hysteresis curves of the as-grown film.

The piezoelectric and ferroelectric properties of the MBE-grown α-In$_2$Se$_3$ were characterized using high-resolution PFM. Looking at the topography and the corresponding out-of-plane PFM phase domains of the MBE-grown 1-2 L In$_2$Se$_3$, a low contrast in the polarization of the PFM phase was observed which can be attributed to the small out-of-plane polarization. Notably, the pristine PFM domains were distinct from the topography, indicating that the formation of domains did not arise purely due to topography differences or artefacts in measurement. Spontaneous polarization was induced by a DC bias of −6 V, and a 5.2×2.5 um$^2$ domain was written on the ~6-nm thick In$_2$Se$_3$, which evidenced the ferroelectric nature of the film. Using switching-spectroscopy PFM, typical ferroelectric butterfly loop and hysteresis loop were observed for the PFM amplitude and PFM phase, respectively, as shown in FIG. 6. The measured coercive voltages were approximately +0.5 V and −2.5 V.

Giant electroresistance ratio of at least 10$^4$ is highly desirable for ferroresistive memory device. However, this is rarely observed in non-tunnelling ferroelectric diode devices. The use of a 2D ferroelectric narrow-bandgap semiconductor allows better tuning of the Schottky barrier through enhancing the Coulomb interactions from its reduced dielectric screening. To further enlarge the differences between the ON and the OFF state resistance, an asymmetric electrode configuration can be used. To demonstrate such a device, a ferroelectric junction was fabricated on the MBE grown 6-nm film by evaporating gold (Au) electrode on top and using the graphene substrate directly as the bottom electrode, as shown in FIG. 4(A). The resultant band alignments are shown in FIG. 4(B). The measured J(V) characteristics with bias applied to the graphene electrode shows a rectifying behaviour and a strong hysteresis in the negative bias range (FIG. 4(C)), where a sharp increase of current density was observed at −2.5 V. This value coincided with the switching voltage measured by PFM, therefore indicating that the J(V) behaviour was determined by the ferroelectric polarizations. The calculated resistance, R=Voltage/Current, for the respective forward (0V to −3V) and backward (−3V to 0V) measurements are shown in the inset of FIG. 4(C). Remarkably, the ratio between the high resistance state (HRS) and low resistance state (LRS) was as high as 3.9×10$^6$, exhibiting a giant electroresistance ratio. This device performance demonstrates that few-layer In$_2$Se$_3$ ferroelectric semiconductor junction can be used as random access memory, requiring a low voltage of ±4 V to write and approximately −1 V to read. At the reading voltage of −1.4 V, the current density was at least 12 A/cm$^2$, which is more than 200% higher than typical ferroelectric diode junctions. Such high current density may be ascribed to the 2D van der Waals nature of In$_2$Se$_3$, and provides unambiguous differentiation of ON and OFF state for memory sense amplifiers.

It should be noted that α-In$_2$Se$_3$ grown on highly ordered pyrolytic graphite (HOPG) substrate gave the same performance as that grown on single layer graphene when fabricated as ferroelectric resistive memory device, thus, the thickness of graphene is not critical to the memory junction performance. The giant electroresistance switching effect can be explained by the interplay of two synergistic factors: (1) the use of 2D van der Waals ferroelectric semiconductor, and (2) the use of highly asymmetric electrodes with higher and lower work function than the ferroelectric semiconductor. Firstly, the use of a ferroelectric semiconductor enables the conductivity to be controlled by modulating the width and height of the Schottky barrier via the polarization of the ferroelectric. Second, the asymmetric electrodes provide a high rectification ratio. Films thicker than 6 nm were used due to their higher thermal stability and resistance to electron beam-induced damage. Due to work function differences, at the metal-semiconductor interfaces, electrons flow from graphene to In$_2$Se$_3$ and from In$_2$Se$_3$ to Au to form space-charged regions. The asymmetric space-charge interfaces thus result in an intrinsic preferential polarization state in the In$_2$Se$_3$ film due to Coulomb interactions (FIG. 4(B)). This also explains the asymmetric coercive voltages measured by PFM. As In$_2$Se$_3$ is an n-type semiconductor, the graphene-In$_2$Se$_3$ interface forms an injecting Ohmic contact and the Au—In$_2$Se$_3$ interface forms a Schottky contact, with the potential barrier given as:

$$\phi_B = \phi_M - \chi$$

where $\phi_B$ is the Schottky barrier, $\phi_M$ is the work function of metal and $\chi$ is the electron affinity of the semiconductor. $\phi_B$ is calculated to be 1.7 eV based on the work function of Au as 5.3 eV, and electron affinity of In$_2$Se$_3$ as 3.6 eV.

Figure 7:
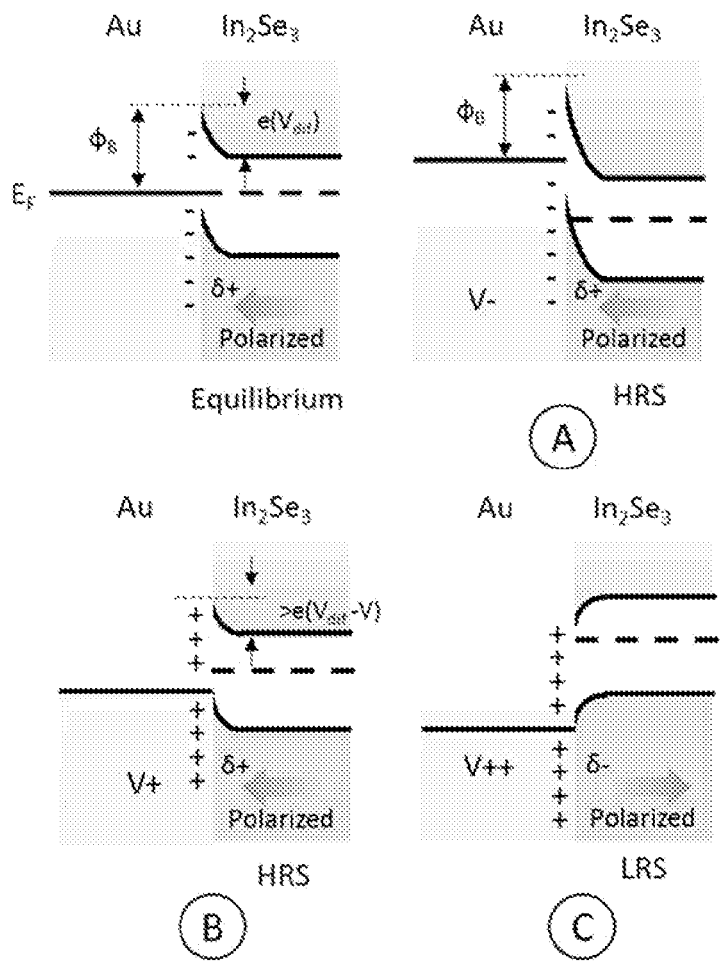
FIG. 7 shows schematics showing the band diagram changes when voltage is applied, in correspondence to the marked A, B and C regions of the J(V) plot in FIG. 4(C).

FIG. 7 illustrates the changes in the Schottky barrier when a voltage bias is applied. At equilibrium, there exists a space-charged depleted region, with a calculated Schottky barrier of ~1.7 eV. When a negative bias is applied to the Au electrode (positive bias to graphene), the depletion zone width increases. At voltage bias greater than the coercive voltage (more positive than 0.5 V, with respect to graphene), the polarization flips towards the Au electrode, and reduces the diffusion potential of the depletion zone. However, the Schottky barrier seen by the transporting electrons does not reduce and electron flow is low (region A of FIG. 4(C)). When a positive bias is applied at the Au electrode (the negative region in FIG. 4(C) plot, with respect to graphene), the barrier seen by the electron flow is given by the diffusion potential:

$$e(V_{dif}) = \phi_M - \phi_S$$

where $e(V_{dif})$ is the diffusion potential and $\phi_S$ is the work function of the semiconductor. It is calculated to be 0.3 eV. With applied bias V, the barrier is reduced by the amount e(V). As the applied bias still is below that of the coercive voltage for flipping (magnitude lower than −2.5 V), the polarization in $In_2Se_3$ still points towards the Au electrode and add on to the potential barrier, making it slightly higher than $e(V_{dif}-V)$. As such, it is still in HRS as shown in region B of FIG. 4(C), and transport is characterized by Schottky emission, with the relationship:

$$I = I_0\left[\exp\left(\frac{eV}{kT}\right) - 1\right].$$

When the magnitude of applied bias is more than the coercive field (−2.5 V with respect to graphene), the polarization in $In_2Se_3$ reverses and points towards the graphene electrode, resulting in reversal of the band bending, and the transport characteristics is ohmic. The lowest resistance is obtained (region C of FIG. 4(C)) when the ferroelectric polarization direction is parallel to the built-in electric field at the metal-semiconductor interface. It is noted that during discharge, there will be no changes to the injecting ohmic contact at graphene-$In_2Se_3$; applied bias is distributed across the semiconductor junction, and is not taken up in the contact area, unlike the Schottky contact.

The use of graphene as the substrate serves two purposes. The first is as an epitaxial substrate for the growth of highly crystalline $In_2Se_3$ films. Another role is to serve as a low work function electrode to compliment the high work function gold electrode, such an asymmetric electrode design maximizes the polarization effect. In view of the fact that the growth of CVD graphene by roll-to-roll process has entered the first stage of commercialization, the epitaxial growth of ultrathin $\alpha$-$In_2Se_3$ on graphene by MBE provides convenient integration in the large-scale fabrication of ferroelectric junctions, since high work function metal such as gold can be directly sputtered onto $\alpha$-$In_2Se_3$-graphene. Another important point is that no "transfer" is needed in this process since the ferroelectric material is directly grown on graphene. Furthermore, the advantage of using $\alpha$-$In_2Se_3$ ferroelectric Schottky diode is that no additional engineering of the barrier is needed, unlike the case of FTJ. Highly competitive performances for on-off current and readout diode current can be achieved compared to FTJ and state-of-the-art ferroelectric diodes. The good performance of the ferroelectric junction may be related to the much lower growth temperature used in the MBE growth (250° C.) as compared to CVD methods (>600° C.), since high growth temperature can cause the desorption of highly volatile indium or selenium species, leading to defects and interfacial traps, which affect reproducibility and stability of switchable diode behaviour.

In conclusion, a method to grow large area $\alpha$-$In_2Se_3$ films on graphene by MBE has been developed, using $In_2Se_3$ and Se powder precursors, and at a low growth temperature, such as a temperature of 250° C. The epitaxial growth grains are highly crystalline and well-oriented, which coalesce to form a uniform and continuous monolayer of $\alpha$-$In_2Se_3$. This MBE growth method can be readily controlled to grow pure phases of any of the following: monolayer $\alpha$-$In_2Se_3$, InSe and $\gamma$-$In_2Se_3$, as well as mixed-phases such as InSe—$In_2Se_3$. An asymmetric ferroresistive memory device has been designed to exploit the 2D semiconducting ferroelectric nature of $\alpha$-$In_2Se_3$ and achieve outstanding performances, with giant electroresistance ratio of $3.9\times10^6$ and readout current density of >12 A/cm². The successful heteroepitaxial growth of large area ferroelectric semiconductor on graphene at modest growth temperature allows the convenient fabrication of high-performance ferroelectric Schottky diode for memory applications.

The invention claimed is:

1. A method of forming a continuous thin film comprising a metal chalcogenide directly on a surface of a substrate, the method comprising:
   providing precursors and a substrate, wherein the precursors comprise a metal chalcogenide and a chalcogen, wherein the metal is selected from the periodic groups 13 or 14 and the chalcogen is: sulphur (S), selenide (Se), or tellurium (Te); and
   thermally evaporating the precursors in a vacuum chamber to directly form the thin film on a surface of the substrate, wherein the vacuum chamber is at a pre-determined pressure and the substrate is at a temperature≤350° C.,
wherein the thin film has a thickness of ≤20 nm.

2. The method according to claim 1, wherein the providing comprises providing an excess of the chalcogen as compared to the metal chalcogenide.

3. The method according to claim 1, wherein the providing comprises providing the chalcogen separately from the metal chalcogenide.

4. The method according to claim 1, wherein the metal chalcogenide is: $In_2Se_3$, $In_2S_3$, $Ga_2Se_3$, $Ga_2S_3$, SnS, SnSe, GeSe, $In_2Te_3$, SnTe, GeTe, GaTe, or a combination thereof.

5. The method according to claim 1, wherein the thermally evaporating comprises evaporating the precursors with an electron beam source.

6. The method according to claim 1, wherein the substrate is at a temperature of 150-300° C.

7. The method according to claim 1, wherein the pre-determined pressure is $1\times10^{-6}$-$1\times10^{-9}$ Torr.

8. The method according to claim 1, further comprising degassing the substrate prior to the thermally evaporating.

9. The method according to claim 8, wherein the degassing comprises flash annealing to a pre-determined temperature.

10. The method according to claim 9, wherein the pre-determined temperature is 250-300° C.

11. The method according to claim 1, wherein the substrate is graphene, highly ordered pyrolytic graphite, or hexagonal boron nitride.

12. The method according to claim 1, further comprising annealing the thin film in a chalcogenide-rich environment.

13. The method according to claim 12, wherein the annealing comprises annealing at a temperature of 250-350° C.

14. A method of forming an asymmetric junction, the method comprising:
   forming a continuous thin film comprising a metal chalcogenide directly on a substrate according to the method of claim 1, wherein the substrate is the first electrode; and
   forming a second electrode on the thin film comprising the metal chalcogenide.

15. The method according to claim 14, wherein the forming a second electrode comprises thermal evaporation.

16. A continuous ferroelectric thin film comprising a metal chalcogenide having a thickness of ≤20 nm, the metal selected from the periodic groups 13 or 14 and the chalcogen is: sulphur (S), selenide (Se), or tellurium (Te), wherein the continuous thin film is a continuous monolayer film.

17. The thin film according to claim 16, wherein the metal is: indium (In), gallium (Ga), tin (Sn), germanium (Ge) or alloys thereof.

18. The thin film according to claim 16, wherein the thickness of the thin film is ≤10 nm.

19. The thin film according to claim 16, wherein the thin film comprises pure phase metal chalcogenide.

20. An asymmetric ferroresistive memory device comprising a continuous thin film comprising a metal chalcogenide, wherein the metal is selected from the periodic groups 13 or 14 and chalcogen is: sulphur (S), selenide (Se) or tellurium (Te), and wherein the thin film has a thickness of ≤20 nm, and wherein the memory device has giant electroresistance ratio up to $3.9 \times 10^6$ and current density of $>10$ A/cm$^2$.

* * * * *